US009252131B2

(12) United States Patent
Cordero et al.

(10) Patent No.: US 9,252,131 B2
(45) Date of Patent: Feb. 2, 2016

(54) CHIP STACK CACHE EXTENSION WITH COHERENCY

(71) Applicant: GLOBALFOUNDRIES INC., Grand Cayman (KY)

(72) Inventors: Edgar R. Cordero, Round Rock, TX (US); Anand Haridass, Bangalore (IN); Subrat K. Panda, Bangalore (IN); Saravanan Sethuraman, Bangalore (IN); Diyanesh Babu Chinnakkonda Vidyapoornachary, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 116 days.

(21) Appl. No.: 14/051,067

(22) Filed: Oct. 10, 2013

(65) Prior Publication Data

US 2015/0106569 A1 Apr. 16, 2015

(51) Int. Cl.
*G06F 12/08* (2006.01)
*H01L 25/065* (2006.01)
*G06F 11/00* (2006.01)
*H01L 25/07* (2006.01)

(52) U.S. Cl.
CPC ............ *H01L 25/0657* (2013.01); *G06F 11/00* (2013.01); *G06F 12/0802* (2013.01); *H01L 25/071* (2013.01); *H01L 2224/16145* (2013.01); *H01L 2225/06513* (2013.01); *H01L 2225/06541* (2013.01)

(58) Field of Classification Search
CPC ............ G06F 12/0888; G06F 12/0808; G06F 12/0875; H01L 25/071; H01L 25/0657; H01L 25/0652; H01L 25/0655

USPC .................................... 711/170, 132, E12.001
See application file for complete search history.

(56) References Cited

U.S. PATENT DOCUMENTS

| 5,732,209 | A | 3/1998 | Vigil et al. |
| 5,778,429 | A | 7/1998 | Sukegawa et al. |
| 6,807,596 | B2 | 10/2004 | Erickson et al. |
| 7,272,759 | B2 | 9/2007 | Blanchard et al. |
| 7,389,403 | B1 | 6/2008 | Alpert et al. |
| 7,584,327 | B2 | 9/2009 | Chen et al. |
| 7,610,537 | B2 | 10/2009 | Dickinson et al. |
| 7,774,551 | B2 | 8/2010 | Gaither et al. |
| 7,827,515 | B2 | 11/2010 | Pannala |
| 8,093,102 | B2 * | 1/2012 | Somani ............... H01L 21/6835 257/686 |
| 2008/0091974 | A1 | 4/2008 | Nakashima |
| 2011/0138167 | A1 | 6/2011 | Conklin et al. |
| 2011/0252260 | A1 | 10/2011 | Flachs et al. |
| 2013/0052760 | A1 * | 2/2013 | Cho ........................ H01L 22/14 438/15 |
| 2014/0298124 | A1 * | 10/2014 | Douskey et al. ............... 714/726 |
| 2015/0067310 | A1 * | 3/2015 | Henry et al. ...................... 713/1 |

FOREIGN PATENT DOCUMENTS

JP     02012032888 A  *  2/2012  ............. G06F 11/20

* cited by examiner

*Primary Examiner* — Pierre-Michel Bataille
(74) *Attorney, Agent, or Firm* — Michael LeStrange; Hoffman Warnick LLC (57) ABSTRACT

By arranging dies in a stack such that failed cores are aligned with adjacent good cores, fast connections between good cores and cache of failed cores can be implemented. Cache can be allocated according to a priority assigned to each good core, by latency between a requesting core and available cache, and/or by load on a core.

19 Claims, 6 Drawing Sheets

CHIP STACK CACHE EXTENSION WITH COHERENCY

BACKGROUND

The invention relates generally to semiconductor structures and fabrication of semiconductor chips and, in particular, to connections and logic enabling management of pooling of cache between dies in a stack of processor chips.

Multi-core processor chips can provide high performance while increasing chip area less than ganging multiple single core processor chips. However, the fabrication of multi-core processors has several challenges, some resulting from the complexity of such processors, and some resulting from spatial and layout requirements. A typical core can include central processing unit (CPU) logic and at least one cache memory. For example, cores of some multi-core processors can include level one (L1), level two (L2), and level three (L3) cache memories working at different speeds, which can provide faster access to data and enhanced processor performance. If one or more cores of a multi-core processor are defective at test, otherwise functional memory dedicated to the failed core(s) can sit unused. As a result, cache memory sharing has been pursued in single-layer or 2D packaging.

As chips grow and/or are ganged together, wire length can reach a point where latency reduces performance and/or increases power consumption. A technique developed to address wire latency is chip or die stacking, also called 3D chip or die stacking. In such stacking, one or more dies or chips are arranged to overlie one another and include features to enable components of the dies or chips to be connected, thus allowing communication between devices or components on different dies or chips. For example, connections can be established through silicon vias, solder bumps, wire bonding, and/or other arrangements and/or techniques, which can shorten effective wire length between components and/or devices. Once connected, additional materials and/or non-communication connections can be made so that the stack effectively becomes a substantially permanently connected semiconductor package. As a result, chip stacking can offer lower power consumption, reduced form factor, and reduced interface latency between components of multiple chips as compared to laying out the same chips in a common plane.

SUMMARY

An embodiment of the invention disclosed herein can take the form of a method of cache management for a semiconductor device stack of at least two dies, each die including at least two computing devices, each computing device including at least one core, each core including a local cache, and each die including at least one shared cache connected to at least one core of the respective die. The method can include testing each core, identifying a core as a failed core responsive to the core failing the testing, and identifying the core as a good core responsive to a core passing the testing. The at least two dies can be stacked such that a good core of a first die is aligned with a failed core of at least one adjacent die, and a failed core local cache of each failed core can be connected to at least a first aligned good core for primary use by the at least a first aligned good core.

Another embodiment of the invention disclosed herein can take the form of a semiconductor device stack having at least two dies. Each die can include, at least two computing devices, and each computing device can include at least one core having associated therewith a respective identifier of good core or failed core. Each computing device can also have a respective local cache connected to each core, at least one shared cache connected to every core of the computing device, and a configuration register connected to every core of the computing device that can store each respective identifier in a respective quality indicator. The at least two dies can be oriented with any failed core of any die aligned with a respective good core of at least one other adjacent die, and the stack can be configured to enter a cache extension mode in which at least one good core is configured to use at least one of a local cache of another core or a shared cache of another computing device.

A further embodiment of the invention disclosed herein can take the form of a method in which each of at least two dies can be tested, each die including at least one computing device with at least one respective core, each core having a respective local core, and each die having at least one shared cache connected to at least one respective core. A quality indicator for each core can be stored in at least one configuration register, the quality indicator identifying the respective core as a failed core or as a good core responsive to the respective core failing or passing the testing, respectively. The dies can be stacked with any failed core in alignment with a respective good core of at least one adjacent die. So stacked, a first latency between a good core and the respective shared cache can be determined, as well as a second latency between the good core and the local cache of a failed core. The local cache of the good core can be connected to the respective one of the local cache or the shared cache associated with the lesser of the first latency and the second latency.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

It is noted that the drawings of the invention are not necessarily to scale. The drawings are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-6, like numbering may represent like elements. Redundant explanation of these elements has been omitted for clarity. Finally, it is understood that the components of FIGS. 1-6 and their accompanying descriptions may be applied to any embodiment described herein.

DETAILED DESCRIPTION

Embodiments of the invention can use firmware (FW), vital product data (VPD), and/or a hypervisor (HV), which are known in the art as tools to implement control of computing devices and so are not described in detail. Thus, it is understood that one of ordinary skill in the art seeing the terms firmware, VPD, and/or hypervisor appearing herein will know to what they refer and how to employ them as taught according to aspects of the invention disclosed herein. It should also be understood that one of ordinary skill in the art will know and understand the terms core, computing device, die, stack, cache, including local cache, remote cache, extended cache, shared cache, level n (Ln) cache where n is an integer, and memory, and will further know how to employ devices to which the terms refer according to embodiments of the invention disclosed herein.

Embodiments of the invention disclosed herein provide a method of cache management for a semiconductor device stack including at least one core on each die in the stack. By identifying failed cores on dies and arranging the dies according to embodiments, dies that might otherwise have been destroyed can be used, and performance of good cores can be enhanced. For example, a good core can overlie or otherwise be aligned with a failed core in the stack so that a connection distance therebetween can be minimized. A cache memory of the failed core can then be connected to at least one good core so that the at least one good core can use the failed core cache memory.

Figure 1:
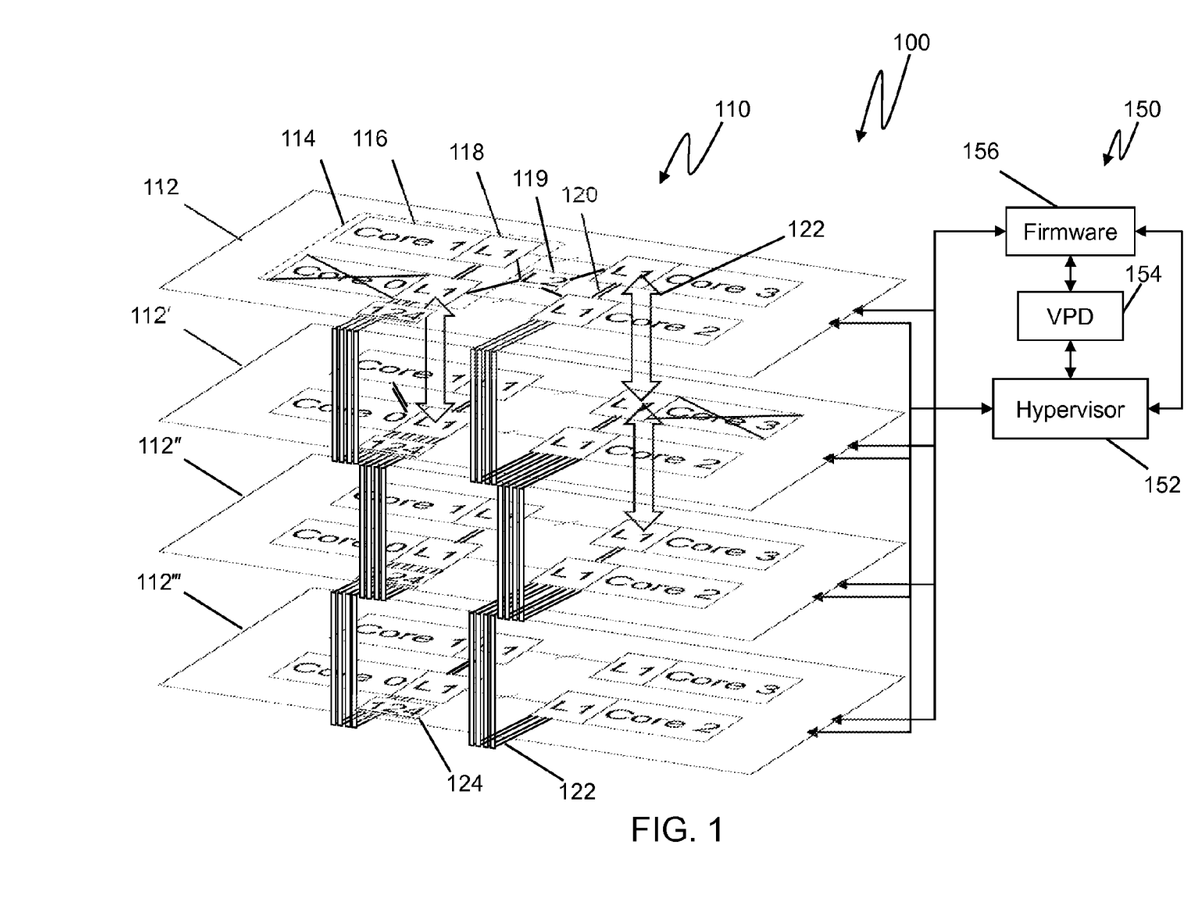
FIG. 1 is a schematic cross sectional illustration of a die stack and cache management system therefore implemented in accordance with embodiments of the invention disclosed herein.

Turning to FIG. 1, a cache management system 100 can include a stack 110 of dies 112, 112', 112", 112'" in communication with a control system 150. Each die 112, 112', 112", 112'" can include at least one computing device 114, which can each include at least one core 116. Each core 114 can include a local cache memory 118, such as a level one (L1) local cache, which can be connected in embodiments to local cache 118 of other cores 116 in a respective die 112, 112', 112", 112'" and/or in another die 112, 112', 112", 112'" of stack 110. For example, first lines 120 can connect a local cache 118 of one core of a first die 112 to a local cache 118 of another core 116 of the same die 112, and second lines 122 can connect a local cache 118 of a core 116 on one die 112 to a local cache 118 of a core 116 on another die 112'. Additional cache memories can be included in some implementations, such as local level two (L2) cache, shared L2 cache, level three (L3) cache, and/or other arrangements. For example, the example of FIG. 1 includes a shared L2 cache 119 on the top die 112 that can be connected to multiple cores of the die and, according to embodiments, one or more cores of another die of stack 110. Each die 112, 112', 112", 112'" can also include a configuration register 124 that can be used to store information about the respective die 112, 112', 112", 112'" and/or core(s) 116 as will be explained below. Thus, second lines 122 can run between configuration registers 124 of dies 112, 112', 112", 112'", though embodiments can instead have a configuration register 124 for each computing device 114 or for each core 116. In embodiments, second lines 122 can include controlled collapsed chip connectors (C4s) and/or through-silicon vias (TSVs), though other types of connections can be employed as may be desired and/or appropriate.

Each configuration register 124 can be responsive to control system 150, which can include a hypervisor 152 in communication with a store of so-called vital product data (VPD) 154 and with firmware 156, which can also be in communication with each other. Hypervisor 152 can read and set each configuration register 124 of stack 110 according to a cache management method of embodiments as will be described. In embodiments, each computing device 114 can include a shared cache that multiple cores 116 can share, and/or each die 112, 112', 112", 112'" can have a shared cache that multiple cores 116 and/or computing devices 114 can share, such as, for example, a L2 cache 119.

Figure 2:
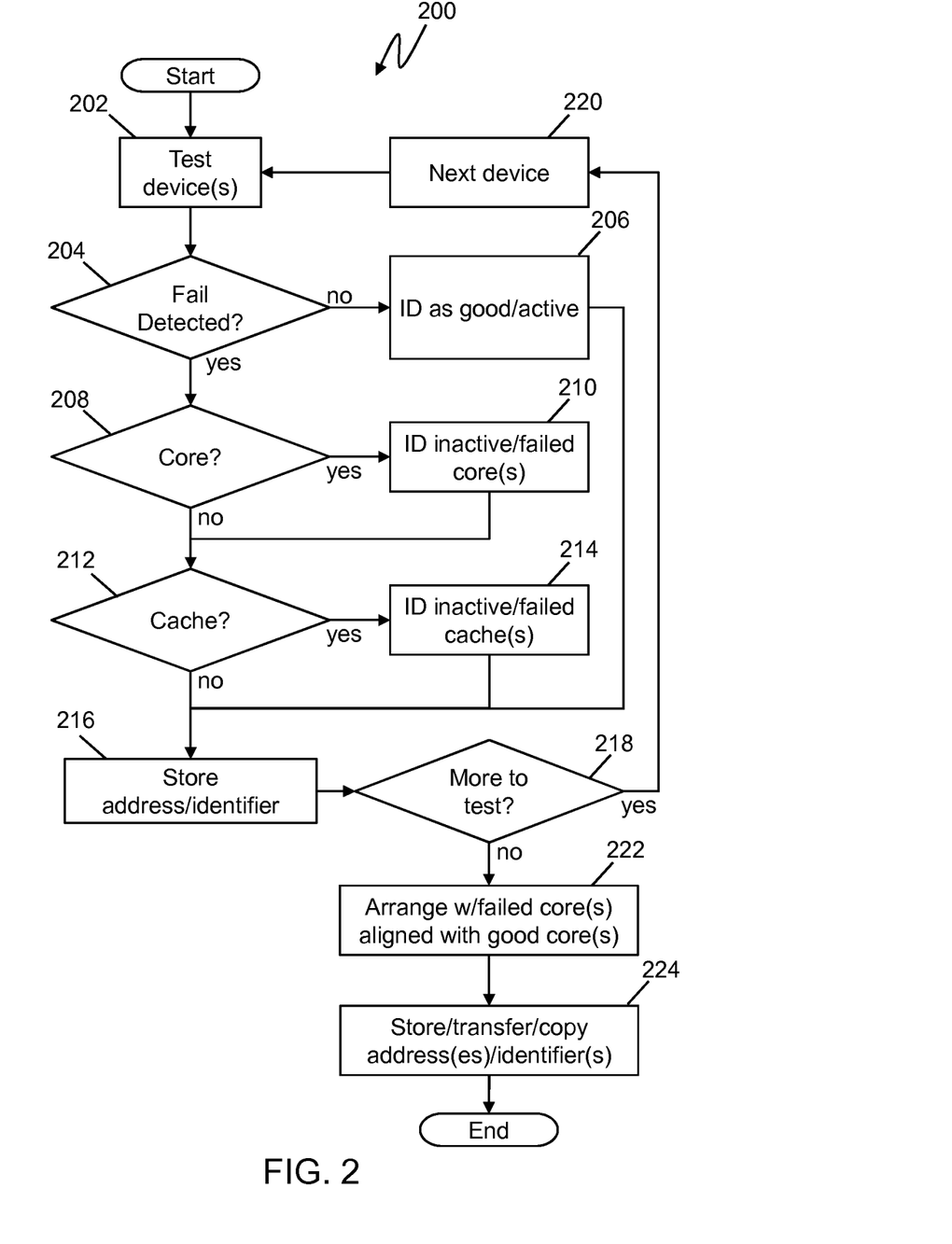
FIG. 2 is a schematic flow diagram illustrating a portion of a cache management method in accordance with an embodiment of the invention disclosed herein.

The particular arrangement of stack 110 in embodiments can be reached using a method 200 illustrated in FIG. 2. Each core and/or other devices can be tested (block 202) after assembly, such as during wafer final testing. For example, each device can be checked for failure (i.e., to see if a failure has been detected) (block 204), such as one at a time, and if no failure is detected, the device under test can be identified as good and/or active (block 206). If a failure is detected at block 204, a check can be made to determine the device is a core 116 (block 208), in which case it can be identified as a failed core (block 210). A check can be made to see whether the failed device is a cache (block 212), and if so the cache can be identified as a failed cache (block 214). The address and/or identifier of the device under test can be stored (block 216), and a check can be made to see whether there are more devices to test (block 218). If there are more to test, then a next device can be identified (block 220), and testing can be repeated from block 202. Once all devices are tested, the dies can be arranged with any failed core(s) aligned with at least one good core on adjacent dies (block 222). In embodiments, the addresses and/or identifiers of the various tested devices can be stored on, transferred to, and/or copied to (block 224) one or more of the stacked dies, such as in a configuration register or another device, and/or can be stored in VPD 154 (FIG. 1) and/or hypervisor 152 (FIG. 1). In embodiments, the identification of each core 116 can include a quality indicator or identifier, such as "good core, good cache," "good core, failed cache," "failed core, good cache," or "failed core, failed cache." In addition, an address of each core can be assigned, such as by a numbering scheme or the like. For example, in the example of FIG. 1, each die 112, 112', 112", 112'" includes four cores 116 that have addresses from 0 to 3, so that each die 112, 112', 112", 112'" can include Core 0, Core 1, Core 2, and Core 3.

Thus, dies 112, 112', 112", 112'" can be arranged such that any failed core 116 can be aligned with a good core 116 of an adjacent die 112, 112', 112", 112'". "Adjacent" in this context can include next lower or next upper/higher, so that an adjacent die can be a next die in stack 110, such as a next lower or next upper die. In the particular example of FIG. 1, Core 0 of top die 112 has been crossed out, representing its identification as a failed core 116, as has been Core 3 of adjacent/next lower die 112'. Rather than have failed Core 3 of adjacent die 112' below failed Core 0 of top die 112, dies 112, 112' can be arranged such that failed Core 0 of top die 112 is aligned with or overlies good Core 0 of adjacent die 112', and failed Core 3 of adjacent die 112' is aligned with good Core 3 of top die 112 and good Core 3 of next adjacent or next lower die 112".

Where local cache 118 of each failed core is good, and thus quality indicators of Core 0 of top die 112 and/or Core 3 of adjacent die 112' can be "failed core, good cache," first lines 120 and/or second lines 122 can be used such that good cores can access and use local cache 118 of one or both failed cores responsive to hypervisor 152. For example, local cache 118 of top die 112 Core 0 can be used by adjacent die Core 0, or another core 116 of top die 112 can use local cache 118 of top die Core 0.

Figure 3:
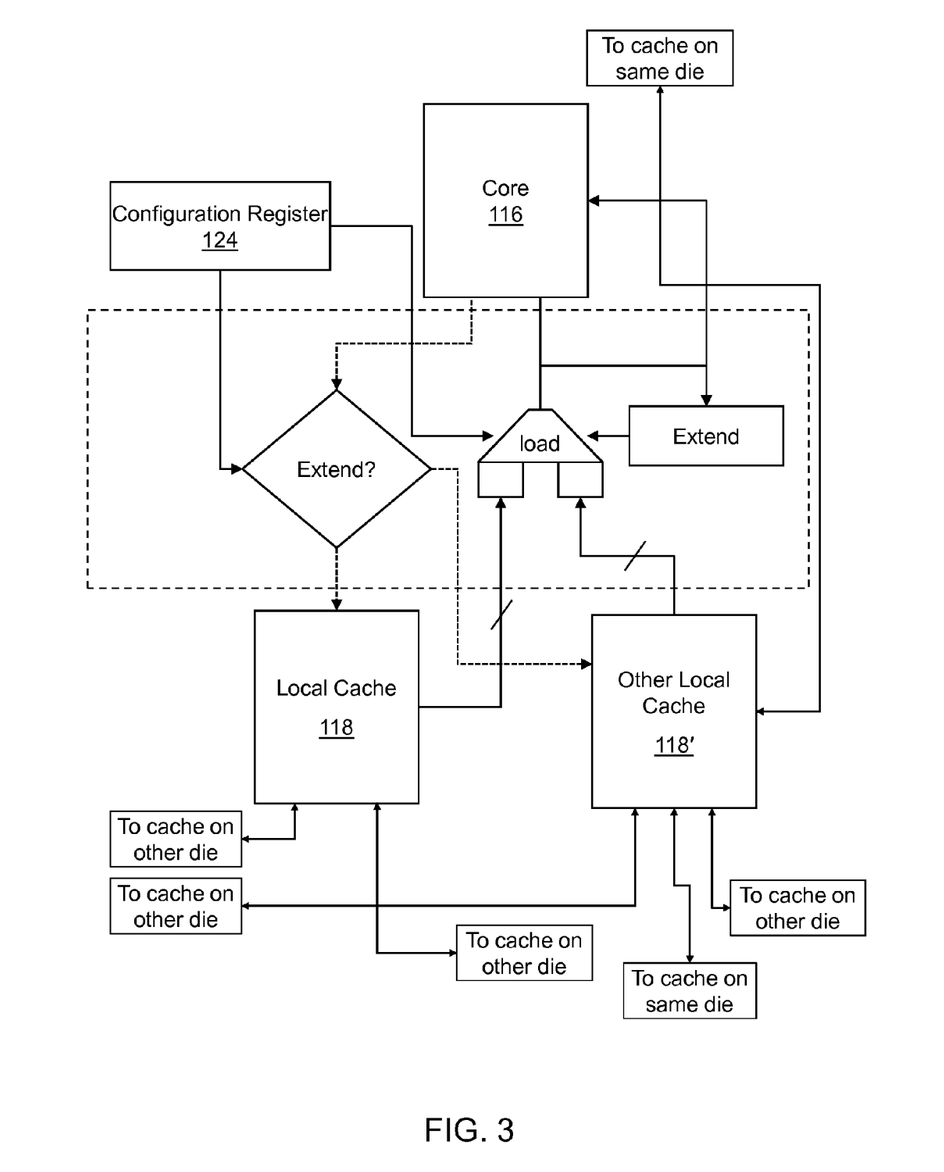
FIG. 3 is a schematic block diagram of a portion of a cache management system implemented in accordance with an embodiment of the invention disclosed herein.
Figure 4:
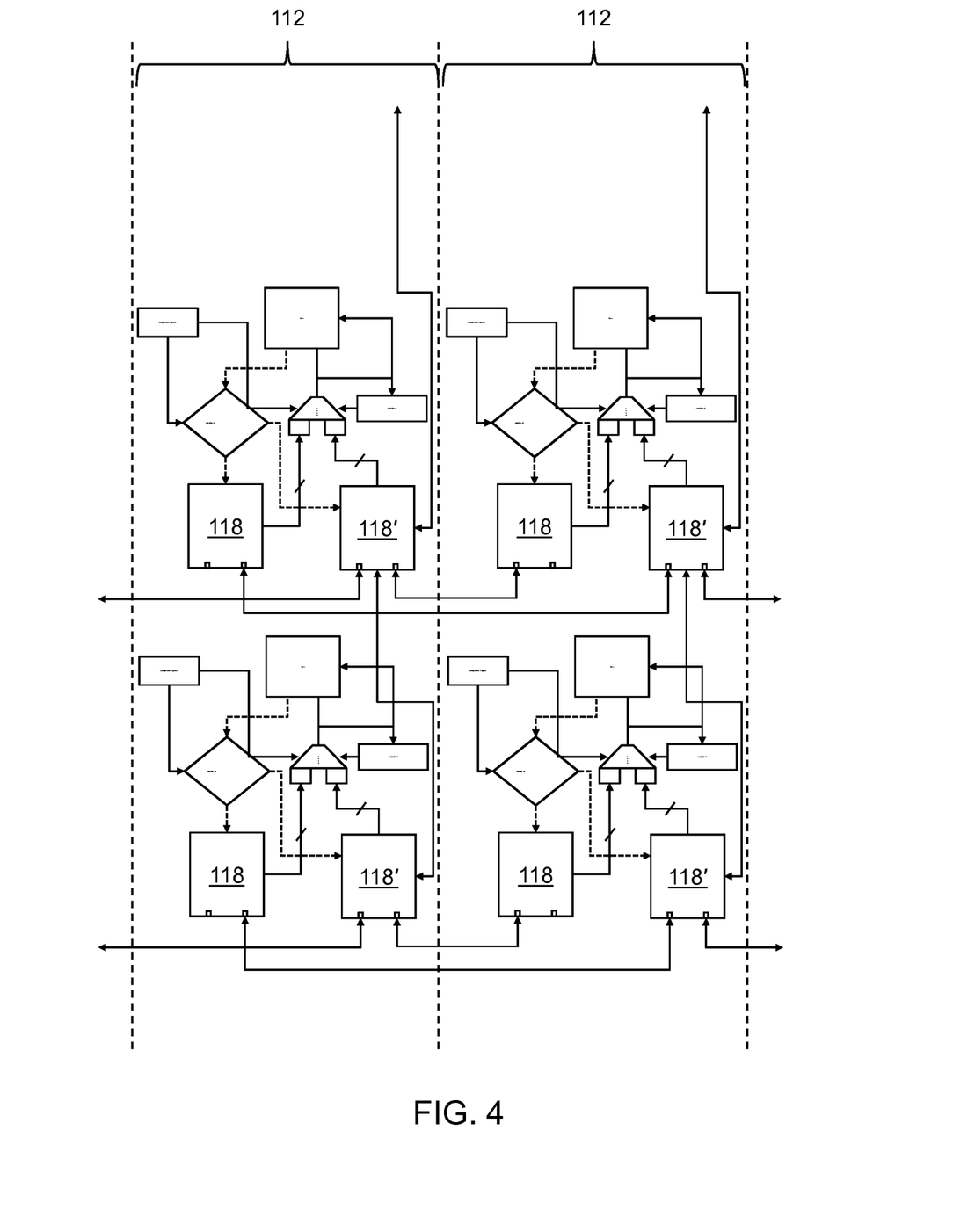
FIG. 4 is a schematic block diagram illustrating interconnection of multiple instances of the portion of a cache management system shown in FIG. 2 and included in portions of two dies in accordance with an embodiment of the invention disclosed herein.

With reference to FIG. 3, embodiments enable a core 116 to access not only its own local cache 118, but also another core's local cache 118'. The access to the other local cache 118' can be enabled based on a load on core 116, a latency between core 116 and the other cache 118', and/or other factors as may be desired and/or appropriate. In embodiments, for example, a latency between any failed core local cache 118' and a connected good core cache 118 can be determined, and the failed core cache 118' can be used by the good core 116 associated with the lowest latency. Thus, in the example of FIG. 1, if a latency between Core 1 and Core 0 of top die 112 is lower than a latency between top die Core 0 and adjacent die Core 0, then top die Core 1 can use failed core local cache of top die Core 0, while if instead the latency between top die Core 0 and adjacent die Core 0 were lower, adjacent die Core 0 could use failed core local cache of top die Core 0. A similar evaluation can be performed in embodiments in which shared cache of one die can be used by a core of another die. Some examples of interconnection between caches are also illustrated in FIG. 3, as well as in FIG. 4, where two cores of each of two dies are shown. In FIG. 4, therefore, four reduced scale versions of the example of FIG. 3 are shown.

every odd L2 block mapped to an extended or remote L2 cache. An additional real address bit can be used to map the addresses to the L2 cache, accordingly. Thus, if a L2 cache includes 512 kilobytes (KB) (0x80000), the $21^{st}$ bit can be used to hash and/or find which L2 it belongs to. This can divide L2 cache accesses between two L2 caches, which can improve performance. This division can be made dynamic, such as when L2 cache misses exceed a threshold number. In some implementations, L2 cache can require a bus bandwidth on the order of 16 Bytes per clock cycle for a DStore action, while a DLoad, DTranslate, and/or IFetch action can require 64 Bytes per clock cycle, which could be achieved by using 640 micro C4s to connect a core of one die to a L2 cache of an adjacent die.

In embodiments in which core and cache addresses and identifiers are stored, such as in VPD 154, such information can be organized as illustrated in TABLE I, below. In TABLE I, the sorts in the first column refer to a number of good cores on a die, each die including eight cores. Thus, for a die having six good cores, the two failed cores can be listed as available cache.

| | Active cores and Cache Availability mark area | | | | | | | |
|---|---|---|---|---|---|---|---|---|
| | Layer 1 | Layer 2 | Layer 3 | Layer 4 | Layer 5 | Layer 6 | Layer 7 | Layer 8 |
| 8C sort | C0 | C1 | C2 | C3 | C4 | C5 | C6 | C7 |
| 6C sort | C0 | C1 | Cache | C2 | C3 | C4 | Cache | C5 |
| 4C sort | Cache | C0 | Cache | C1 | Cache | C2 | Cache | C3 |

Similarly, allocation of cache access can be organized as illustrated in TABLE II, below. As in TABLE I, the sorts in the first column refer to the number of good cores on an eight-core die, and the remaining columns indicate a preferred priority of access to available cache, if any. For example, for a six-core sort, a first available cache can be accessed by Core 2 with highest priority and by Core 1 with next priority. Thus, Core 2 can have primary allocation (P), whereas Core 1 can have secondary allocation (S).

| | Primary usage allocation (P) and Secondary usage allocation (S) entry mark Area | | | | | | | |
|---|---|---|---|---|---|---|---|---|
| | Layer 1 | Layer 2 | Layer 3 | Layer 4 | Layer 5 | Layer 6 | Layer 7 | Layer 8 |
| 8C sort | C0 | C1 | C2 | C3 | C4 | C5 | C6 | C7 |
| 6C sort | | C1 (S, L3) | Cache | C2 (P, L3) | | C4 (S, L7) | Cache | C5 (P, L7) |
| 4C sort | Cache | C0 (P, L1/S, L3) | Cache | C1 (P, L3/S, L5) | Cache | C2 (P, L5/S, L7) | Cache | C3 (P, L7) |

In embodiments, with reference to FIGS. 1 and 3, each configuration register 124 can include a respective scan communication (SCOM) register for each computing device with at least an extension mode bit. A first value of the extension mode bit can indicate that extension mode is enabled, and a second value of the extension mode bit can indicate that extension mode is disabled. Each SCOM register can further include at least two respective failed core cache bits for every failed core of the respective computing device, values of the failed core cache bits storing an address of a failed core. For example, a first bit can indicate a die of a failed core, and a second bit can indicate which core of the die is the failed core.

More particularly, in embodiments in which each core includes local L1 and local L2 cache and in which L2 cache is made accessible to multiple cores, an address scheme can have every even L2 block mapped to a current L2 cache and As an example of operation of embodiments, consider FIG. 1 and that Core 0 of the top die, initially a good core, experiences a failure during operation. Here, the hypervisor would ordinarily simply remove the failed core and its associated resources from the resource pool, but in embodiments, any cache of the failed core can be reallocated for use by adjacent cores. Thus, a failure can be identified, such as by firmware 156, and a request can be sent to hypervisor 152 to remove the failed core from the resource pool. Hypervisor 152 can list or otherwise identify the failed core as "cache only" or "failed core, good cache" and can indicate availability of the local cache of the failed core, such as by updating firmware 156, which can allocate the failed core local cache to good cores as necessary and can also update VPD 154.

In another example of operation of embodiments, an operating good core can send a request, such as to firmware 156, for additional cache memory. In this example, any cache in the stack can be used, not only failed core local cache. The request can be passed on to hypervisor 152, which can free up cache and identify which and how much is available, such as by updating firmware 156. The additional cache memory can be released to the requesting core, such as by firmware 156, which can also update VPD 154 to reflect that cache is shared. Once the requesting core is done with the additional cache, the additional cache can be released, such as by firmware 156 taking control of the additional cache. The additional cache can then be reallocated to the core with which it might ordinarily be associated, such as by firmware 156 and/or hypervisor 152, and VPD 154 can be updated to reflect the reallocation.

In a further example of operation of embodiments, an operating good core that is not connected to extended cache and/or does not have sufficient extended cache available can send a request, such as to firmware 156 or to hypervisor 152, for additional resources in response to a memory intensive or otherwise complicated and/or resource intensive workload. For example, such a core can request that the memory intensive workload be reassigned to a core that has extended cache available. Alternatively, hypervisor 152 can monitor the cores to determine when a core requires additional resources and/or when a workload should be reassigned to a core that has extended cache available. The request can be passed on to hypervisor 152, which can reassign the workload and identify to which core the workload has been assigned, such as by updating firmware 156. The originally-assigned core can be released and/or assigned a new workload, such as by firmware 156 and/or hypervisor 152, which can also update stored information and/or be updated to reflect that the core is available and/or has been assigned a new workload.

Figure 5:
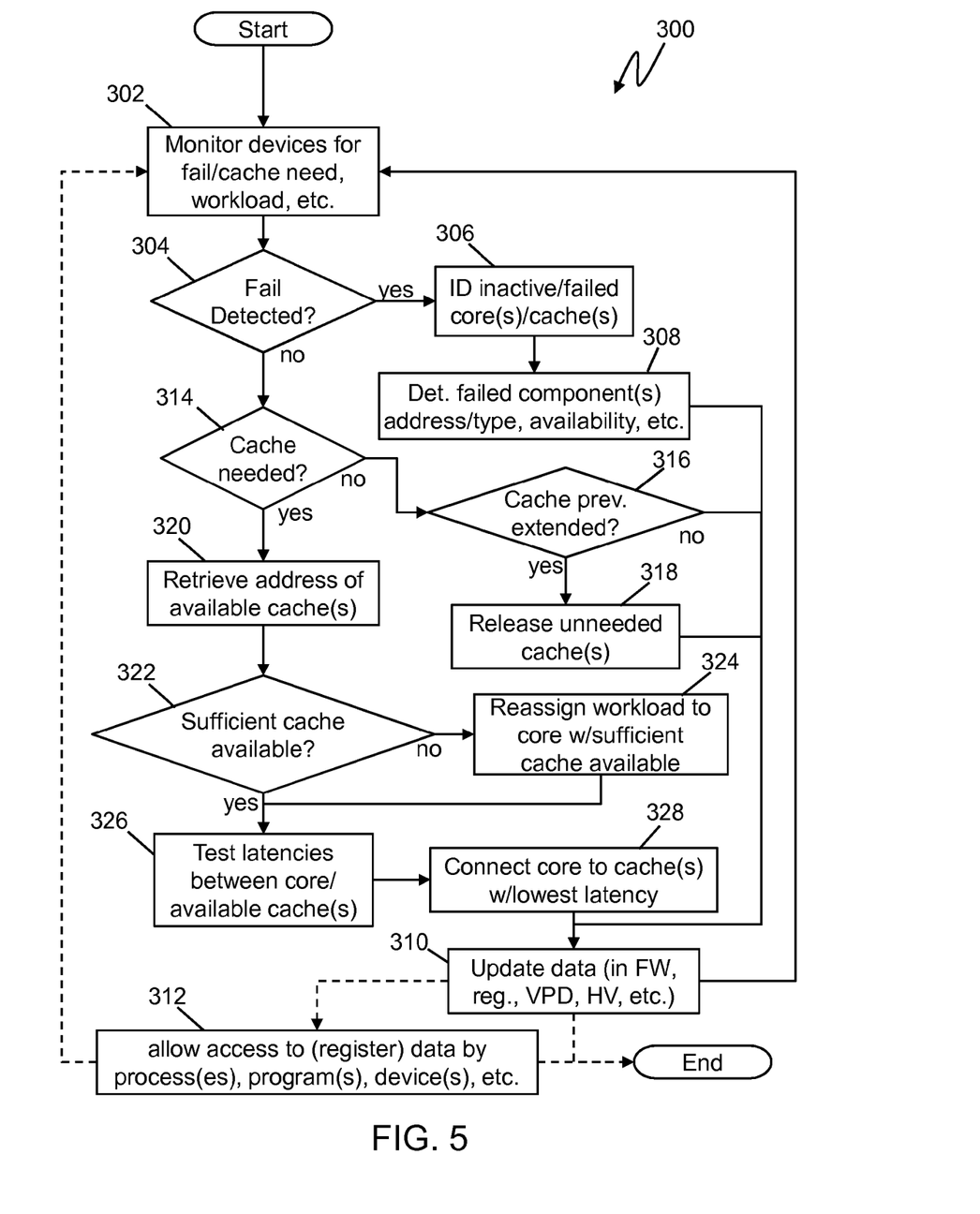
FIG. 5 is a schematic flow diagram illustrating another portion of a cache management method in accordance with another embodiment of the invention disclosed herein.

Thus, with reference to FIG. 5, embodiments can include a method 300 in which devices can be monitored for failure, cache need/requests, workload, and/or other parameters (block 302). At block 304, if a failure is detected, then the failed device can be identified (block 306), an address and/or type of failure/device (failed core, failed cache, etc.) can be determined and/or stored (block 308), any register and/or firmware and/or VPD can be updated (block 310), and monitoring can resume (block 302). Embodiments can also allow access by process(es), program(s), device(s), and/or other components to the data (block 312), though this can be optional. In addition to any address and/or type of component that has failed, an indication that cache associated with a failed core is available as extended cache and to which core(s) and/or device(s) and/or die(s) the cache can be made available, that a failed cache is no longer available, and/or other relevant data can be stored as part of blocks 306, 308, and/or 310, such as, for example, in FW, a configuration register, and/or VPD.

If no failure is detected at block 304, a check can be made to see if cache is needed (block 314), such as a core requesting cache and/or a core previously having been allocated extended cache. For example, a cache extension request and/or core augmentation request can result from a core being assigned a memory-intensive workload and/or job and/or process. If cache is not needed, then a check can be made to see if a core previously has been allocated extended cache (block 316). If cache was not previously extended or allocated, then data can be updated if necessary (block 310), and monitoring can resume (block 302), access to the data being optionally granted (block 312), while if cache was previously granted, unneeded cache(s) can be released (block 318) before updating data.

If at block 314 it is determined that cache is needed, such as a cache request having been detected and/or received and/or the hypervisor determining that more cache is required for a workload, then an address of one or more or every available cache can be retrieved (block 320). A check can be made to determine whether sufficient cache is available (block 322), and if not, a workload can be reassigned to a core that has access to sufficient cache (block 324). If sufficient cache is available and/or if a workload has been assigned to a core to which sufficient cache is available, then in embodiments, the requesting core can simply be connected to an available cache, but in other embodiments, latency between the requesting core and the available cache(s) can be determined (block 326) and the requesting core can be connected to the cache(s) with the lowest latency (block 328). Data can be updated if necessary (block 310), and monitoring can resume (block 302), access to the data being optionally granted (block 312). It should be noted that data can be updated after any operation if so desired.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing, such as can be considered non-transitory. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible or non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks and/or configure the computer or other programmable data processing apparatus to perform a method and/or functions in accordance with embodiments.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
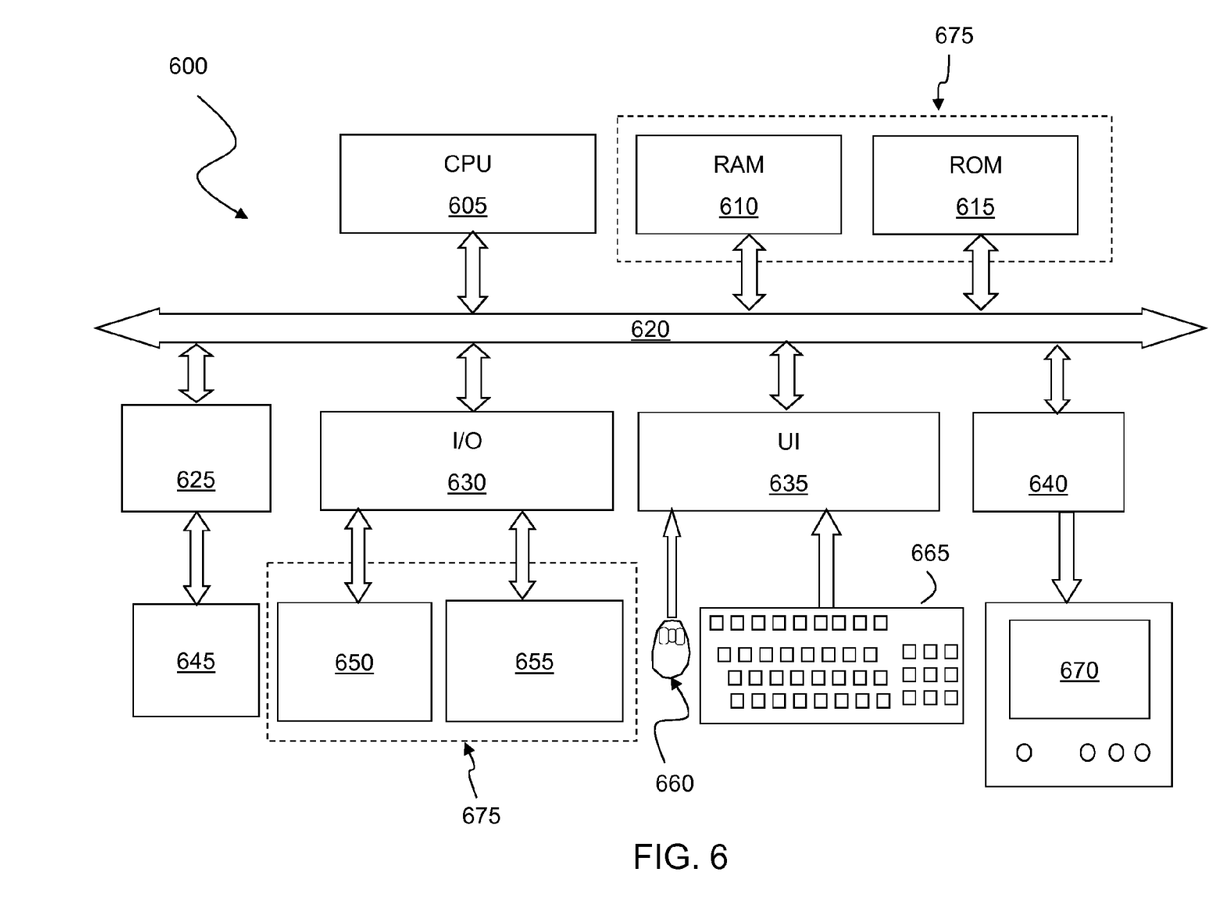
FIG. 6 is a schematic block diagram of a computing environment in which embodiments of the invention disclosed herein can be implemented.

Turning now to FIG. 6, an example of a block diagram of a general-purpose computer system 600 which can be used to implement the method, system, computer program, and/or computer program product described herein. The method, system, computer program, and/or computer program product may be coded as a set of instructions on removable or hard media for use by general-purpose computer, and thus may, in embodiments, include a computer program product. FIG. 6 is also a schematic block diagram of a general-purpose computer for practicing the present invention. Computer system 600 can have at least one microprocessor or central processing unit (CPU) 605. CPU 605 can be interconnected via a system bus 620 to machine readable media 675, which can include, for example, a random access memory (RAM) 610, a read-only memory (ROM) 615, a removable and/or program storage device 655, and/or a mass data and/or program storage device 650. An input/output (I/O) adapter 630 can connect mass storage device 650 and removable storage device 655 to system bus 620. A user interface 635 can connect a keyboard 665 and/or a mouse 660 and/or and other suitable input device to system bus 620, and a port adapter 625 can connect a data port 645 to system bus 620 and a display adapter 640 can connect a display device 670. ROM 615 can include the basic operating system for computer system 600. Examples of removable data and/or program storage device 655 include magnetic media such as floppy drives, tape drives, portable flash drives, zip drives, and optical media such as CD ROM or DVD drives. Examples of mass data and/or program storage device 650 include hard disk drives and non-volatile memory such as flash memory. In addition to keyboard 665 and mouse 660, other user input devices such as trackballs, writing tablets, pressure pads, microphones, light pens and position-sensing screen displays may be connected to user interface 635. Examples of display device 670 include cathode-ray tubes (CRT), liquid crystal diode (LCD) displays, light emitting diode (LED) displays, plasma displays, holographic displays, tactile displays, and/or any other display device as may be available, suitable, and/or known now and/or in the future.

A machine readable computer program may be created by one of skill in the art and stored in computer system 600 or a data and/or any one or more of machine readable medium 675, such as in the form of a computer program product 680, to simplify the practicing of this invention. In operation, information for the computer program created to run the present invention can be loaded on the appropriate removable data and/or program storage device 655, fed through data port 645, and/or entered using keyboard 665. A user can control the program by manipulating functions performed by the computer program and providing other data inputs via any of the above mentioned data input means. Display device 670 can provide a means for the user to accurately control the computer program and perform the desired tasks described herein.

Computer program product 680 according to embodiments of the invention disclosed herein can be stored in memory and/or computer readable storage media 675, in embodiments. While shown as outside of RAM 610 and ROM 615, it should be readily apparent that computer program product 680 and/or portions thereof can reside in these and/or any other storage medium accessible by computer system 600. It should be noted that CPU(s) 605 can in embodiments be called a computing device(s), but that computer system 600 as a whole, or portions thereof, could also be called a computing device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device stack comprising:
at least two dies, each die including:
at least two computing devices, each computing device including:
at least one core having associated therewith a respective identifier of good core or failed core; and
a respective local cache connected to each core;
at least one shared cache connected to every core of the computing device; and
a configuration register connected to every core of the computing device and storing each respective identifier in a respective quality indicator,
wherein the at least two dies are oriented with any failed core of any die aligned with a respective good core of at least one other adjacent die,
the stack being configured to enter a cache extension mode in which at least one good core is configured to use at least one of a local cache of another core or a shared cache of another computing device.

2. The stack of claim 1, wherein each configuration register includes a respective scan communication (SCOM) register for each computing device configured to store an extension mode indicator of whether cache extension mode is enabled and at least one cache indicator of a respective enabled cache.

3. The stack of claim 2, wherein a respective local cache of a good core is connected to one of a respective local cache of a failed core or a respective shared cache of a computing device including the failed core responsive to each respective SCOM and each respective quality indicator.

4. The stack of claim 1, wherein the stack is responsive to a hypervisor configured to communicate with every configuration register, to monitor the at least one good core of the stack, and to control at least one configuration register responsive to the quality indicators and to a load on each core.

5. A method comprising:
testing each of at least two dies each including at least one computing device with at least one respective core, each core having a respective local core, and each die having at least one shared cache connected to at least one respective core;
storing a quality indicator for each core in at least one configuration register, the quality indicator identifying the respective core as a failed core or as a good core responsive to the respective core failing or passing the testing, respectively;
stacking the dies with any failed core in alignment with a respective good core of at least one adjacent die;
determining a first latency between a good core and the respective shared cache;
determining a second latency between the good core and the local cache of a failed core; and
connecting the local cache of the good core to the respective one of the local cache or the shared cache associated with the lesser of the first latency and the second latency.

6. The method of claim 5, further comprising connecting a failed core local cache to at least a first aligned good core for primary use by the first aligned good core and to at least a second aligned good core for secondary use by the second aligned good core.

7. The method of claim 5, further comprising storing register data indicative of a connection between the local cache of a good core with another cache.

8. A cache management method for a semiconductor device stack of at least two dies, each die including at least two computing devices, each computing device including at least one core, each core including a local cache, and each die including at least one shared cache connected to at least one core of the respective die, the method comprising:
testing each core;
responsive to a core failing the testing, identifying the core as a failed core;
responsive to a core passing the testing, identifying the core as a good core;
stacking the at least two dies such that a good core of a first die is aligned with a failed core of at least one adjacent die; and
connecting a failed core local cache of each failed core to at least a first aligned good core for primary use by the at least a first aligned good core.

9. The method of claim 8, further comprising storing a respective quality indicator and a respective address of each core, the respective quality indicator including one of good core, good core with failed cache, failed core with good cache, or failed core with failed cache.

10. The method of claim 9, wherein the stacking of the at least two dies includes using the respective quality indicator and respective address of each core so that any failed core with good cache of one die is aligned with at least one respective good core of at least one adjacent computing device.

11. The method of claim 8, further comprising providing a respective scan communication (SCOM) register for each computing device with at least an extension mode bit, a first value of the extension mode bit indicating that extension mode is enabled and a second value of the extension mode bit indicating that extension mode is disabled, the respective SCOM register further including at least two respective failed core cache bits for every failed core of the respective computing device.

12. The method of claim 11, further comprising managing use of any failed core cache by each respective aligned good core using a hypervisor in communication with the SCOM register for each computing device.

13. The method of claim 8, wherein each core includes a respective local cache, each die includes a respective shared cache, and the method further comprises determining a first latency between a good core and the respective shared cache, determining a second latency between the good core and the local cache of a failed core, and connecting the local cache of the good core to the respective one of the local cache or the shared cache associated with the lesser of the first latency and the second latency.

14. The method of claim 8, further comprising connecting the failed core cache to at least a second aligned good core for secondary use when the first aligned good core is not using the failed core cache.

15. The method of claim 8, further comprising monitoring each good core for a failure, identifying any good core experiencing a failure as a failed core, and assigning a failed core cache of any failed core to at least one good core.

16. The method of claim 15, further comprising storing register data indicative of the assignment of the any failed core cache and allowing access to the register data by at least one of a running process, a running program, or a device.

17. The method of claim 8, further comprising, responsive to a first good core needing additional cache, assigning at least a portion of a respective good core cache of a second good core to the first good core.

18. The method of claim 17, further comprising reassigning the at least a portion of the respective good core cache to the second good core responsive to the first good core no longer needing additional cache.

19. The method of claim 8, further comprising sending a memory intensive workload to the at least the first aligned good core.

\* \* \* \* \*